United States Patent
Yoshida

(10) Patent No.: US 10,976,371 B2
(45) Date of Patent: Apr. 13, 2021

(54) BATTERY MONITORING DEVICE HAVING HIGH COLLING EFFICIENCY

(71) Applicant: Yazaki Corporation, Tokyo (JP)

(72) Inventor: Haruhiko Yoshida, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 291 days.

(21) Appl. No.: 16/196,280

(22) Filed: Nov. 20, 2018

(65) Prior Publication Data

US 2019/0154761 A1    May 23, 2019

(30) Foreign Application Priority Data

Nov. 22, 2017   (JP) ............................. JP2017-224321

(51) Int. Cl.
| | | |
|---|---|---|
| *H01M 10/46* | (2006.01) |
| *G01R 31/382* | (2019.01) |
| *H01M 10/48* | (2006.01) |
| *H02J 7/00* | (2006.01) |
| *G01R 31/396* | (2019.01) |
| *H01M 10/6551* | (2014.01) |

(Continued)

(52) U.S. Cl.
CPC ......... *G01R 31/382* (2019.01); *G01R 31/396* (2019.01); *H01M 10/48* (2013.01); *H01M 10/625* (2015.04); *H01M 10/6551* (2015.04); *H02J 7/0016* (2013.01); *H02J 7/0021* (2013.01); *H01M 2010/4271* (2013.01); *H01M 2010/4278* (2013.01)

(58) Field of Classification Search
CPC ...... H02J 7/0016; H02J 7/0026; H02J 7/0047; H02J 7/0048; H02J 7/005; H01M 10/48; H01M 2010/4271; H01M 10/4207; H01M 10/4285; G01R 31/382
USPC ........ 320/107, 114, 116, 118, 132, 149, 150, 320/DIG. 19, DIG. 21; 324/428, 433, 434
See application file for complete search history.

(56) References Cited

U.S. PATENT DOCUMENTS

| | | | |
|---|---|---|---|
| 2007/0247116 A1 | 10/2007 | Morita et al. | |
| 2011/0155485 A1* | 6/2011 | Tsurumi | H01M 10/425 180/65.1 |

(Continued)

FOREIGN PATENT DOCUMENTS

| | | |
|---|---|---|
| JP | 2007-288883 A | 11/2007 |
| JP | 2011-119102 A | 6/2011 |

(Continued)

OTHER PUBLICATIONS

JP 2014-160571 (Apr. 9, 2014) translation (Year: 2014).*

*Primary Examiner* — Edward Tso
(74) *Attorney, Agent, or Firm* — Sughrue Mion, PLLC

(57) ABSTRACT

A battery monitoring device includes a monitoring control unit configured to monitor a battery state of each battery cell of a battery module formed by arranging the plurality of battery cells and control each of the battery cells on the basis of a monitoring result. The monitoring control unit has a heat radiation source that radiates heat as an electric current flows, and the heat radiation source is arranged in a position where air discharged from a gap between the neighboring battery cells collides with the heat radiation source. For example, the heat radiation source is arranged to face an outlet port from which the air of the gap between the neighboring battery cells is discharged.

20 Claims, 8 Drawing Sheets

(51) Int. Cl.
*H01M 10/625* (2014.01)
*H01M 10/42* (2006.01)

(56) References Cited

U.S. PATENT DOCUMENTS

| | | | |
|---|---|---|---|
| 2012/0214041 A1* | 8/2012 | Harada | H01M 10/617 429/120 |
| 2015/0162759 A1* | 6/2015 | Fujii | H01M 10/425 320/118 |
| 2016/0164318 A1 | 6/2016 | Sekizaki et al. | |

FOREIGN PATENT DOCUMENTS

| | | |
|---|---|---|
| JP | 2014-160571 A | 9/2014 |
| WO | 2015/029544 A1 | 3/2015 |

* cited by examiner

BATTERY MONITORING DEVICE HAVING HIGH COLLING EFFICIENCY

CROSS-REFERENCE TO RELATED APPLICATION(S)

The present application claims priority to and incorporates by reference the entire contents of Japanese Patent Application No. 2017-224321 filed in Japan on Nov. 22, 2017.

BACKGROUND OF THE INVENTION

1. Field of the Invention

The present invention relates to a battery monitoring device.

2. Description of the Related Art

In the related art, a vehicle such as an electric automobile or a hybrid car is mounted with a battery module for feeding electricity or charging regenerative power to a motor serving as a driving source. In this battery module, a plurality of battery cells having positive and negative electrode terminals are arranged, and the electrode terminals of the neighboring battery cells are electrically connected to each other with a conducting member. In such a type of the battery module, as charge and discharge operations are repeated, a difference in the battery capacity may occur between the battery cells. However, in the battery module, it is possible to obtain high output power, stabilize the output power, and improve a battery service lifetime by removing such a difference of the battery capacity between the battery cells. For this reason, a battery monitoring device for monitoring a battery state (such as voltage, current, and temperature) of each battery cell is connected to the battery module. The battery monitoring device is disclosed, for example, in WO 2015/029544 A and Japanese Patent Application Laid-open No. 2007-288883.

Incidentally, in the battery monitoring device, a battery monitoring integrated circuit (so-called battery monitoring IC) or various elements (such as a resistor and a capacitor) are embedded on a circuit board. These components radiate heat as the electric current flows, and thus may serve as a heat source. For example, Japanese Patent Application Laid-open No. 2007-288883 discloses a technique of equalizing battery capacities between each battery cell on the basis of a monitoring result of the battery monitoring device. In this technique, a discharge resistor is provided in each battery cell, and the electric current flows to the discharge resistor of the battery cell having a large battery capacity, in order to consume the battery capacity of the battery cell. In this technique, the discharge resistor serves as a heat radiation source. Furthermore, another heat radiation source is arranged in an upstream of the discharge resistor in the middle of the air flow path. Therefore, in the related art, there is room for improving cooling efficiency of the heat radiation source.

SUMMARY OF THE INVENTION

In this regard, a purpose of the present invention is to provide a battery monitoring device having high cooling efficiency.

According to an aspect of the invention, a battery monitoring device includes a monitoring controller configured to monitor a battery state of each battery cell of a battery module formed by arranging the plurality of battery cells and control each of the battery cells on the basis of a monitoring result, the monitoring controller having a heat radiation source that radiates heat as an electric current flows. The heat radiation source is arranged in a position where air discharged from a gap between the neighboring battery cells collides with the heat radiation source.

According to another aspect of the invention, in the battery monitoring device, the heat radiation source may be arranged to face an outlet port from which the air of the gap between the neighboring battery cells is discharged.

According to still another aspect of the invention, the battery monitoring device may include a guide portion configured to guide the air discharged from the gap between the neighboring battery cells to the heat radiation source.

According to still another aspect of the invention, the battery monitoring device may include a housing member configured to house the monitoring controller. The housing member may have a wall body interposed between the heat radiation source and the battery module, and the wall body may have an air introduction hole configured to flow the air discharged from the gap between the neighboring battery cells to a housing chamber of the housing member.

According to still another aspect of the invention, in the battery monitoring device, the housing member may have a discharge hole configured to discharge the air of the housing chamber colliding with and passing through the heat radiation source to the outside of the housing chamber.

According to still another aspect of the invention, in the battery monitoring device, the monitoring controller may have a discharge resistor in each of the battery cells as the heat radiation source, and battery capacities of all the battery cells may be equalized by flowing an electric current to the discharge resistor of the battery cell set as a discharge target on the basis of the monitoring result.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
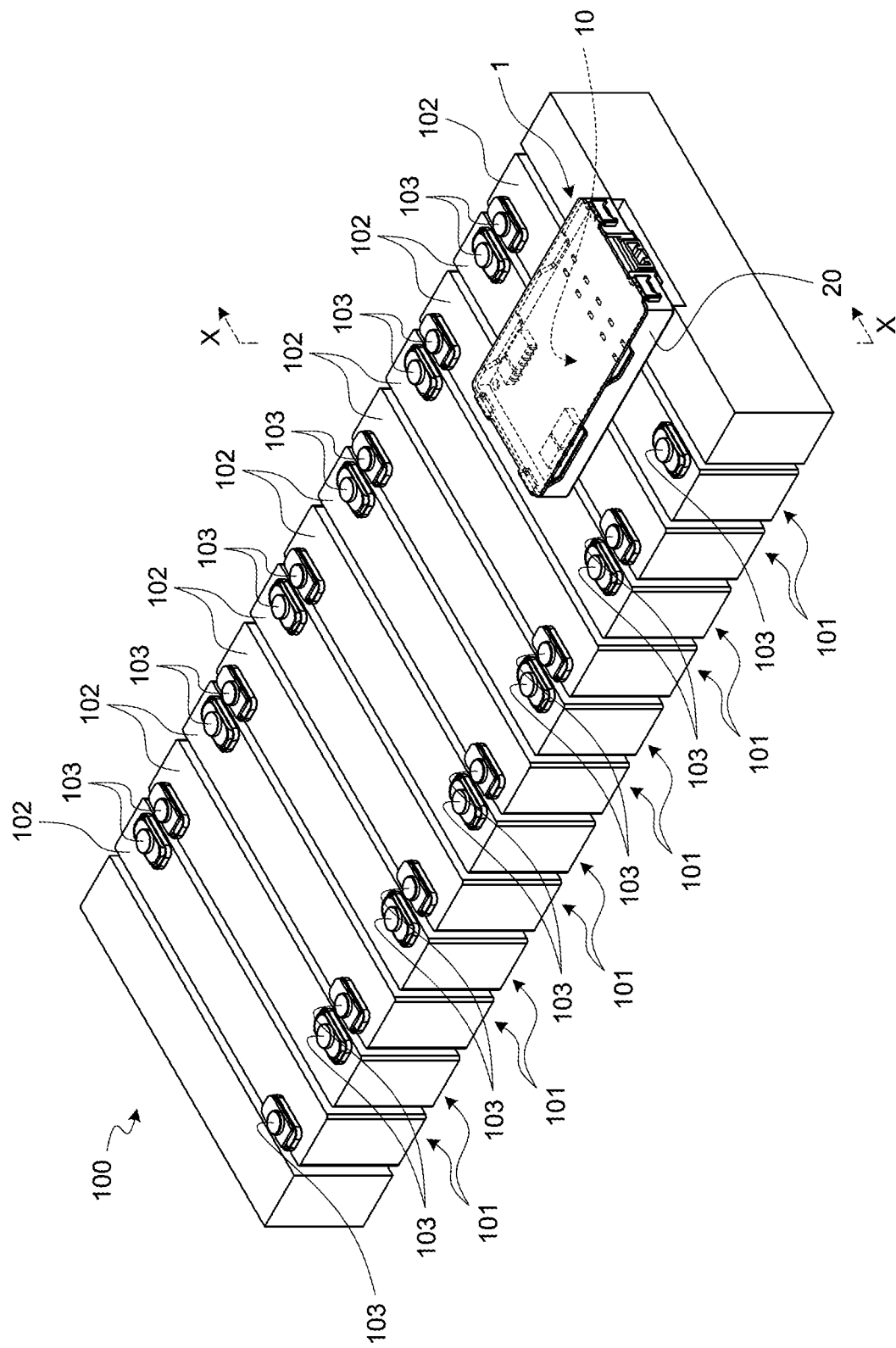
FIG. 1 is a perspective view illustrating a battery monitoring device according to an embodiment along with battery modules.

A battery monitoring device according to an embodiment of the invention will now be described in details with reference to the accompanying drawings. Note that the invention is not limited to such embodiments.

Embodiment

A battery monitoring device according to an embodiment of the invention will be described with reference to FIGS. 1 to 9.

In FIGS. 1 to 5, reference numeral 1 is a battery monitoring device according to this embodiment. In addition, in FIGS. 1 and 2, reference numeral 100 is a battery module as a target for applying the battery monitoring device 1. Here, first, the battery module 100 will be described.

Figure 2:
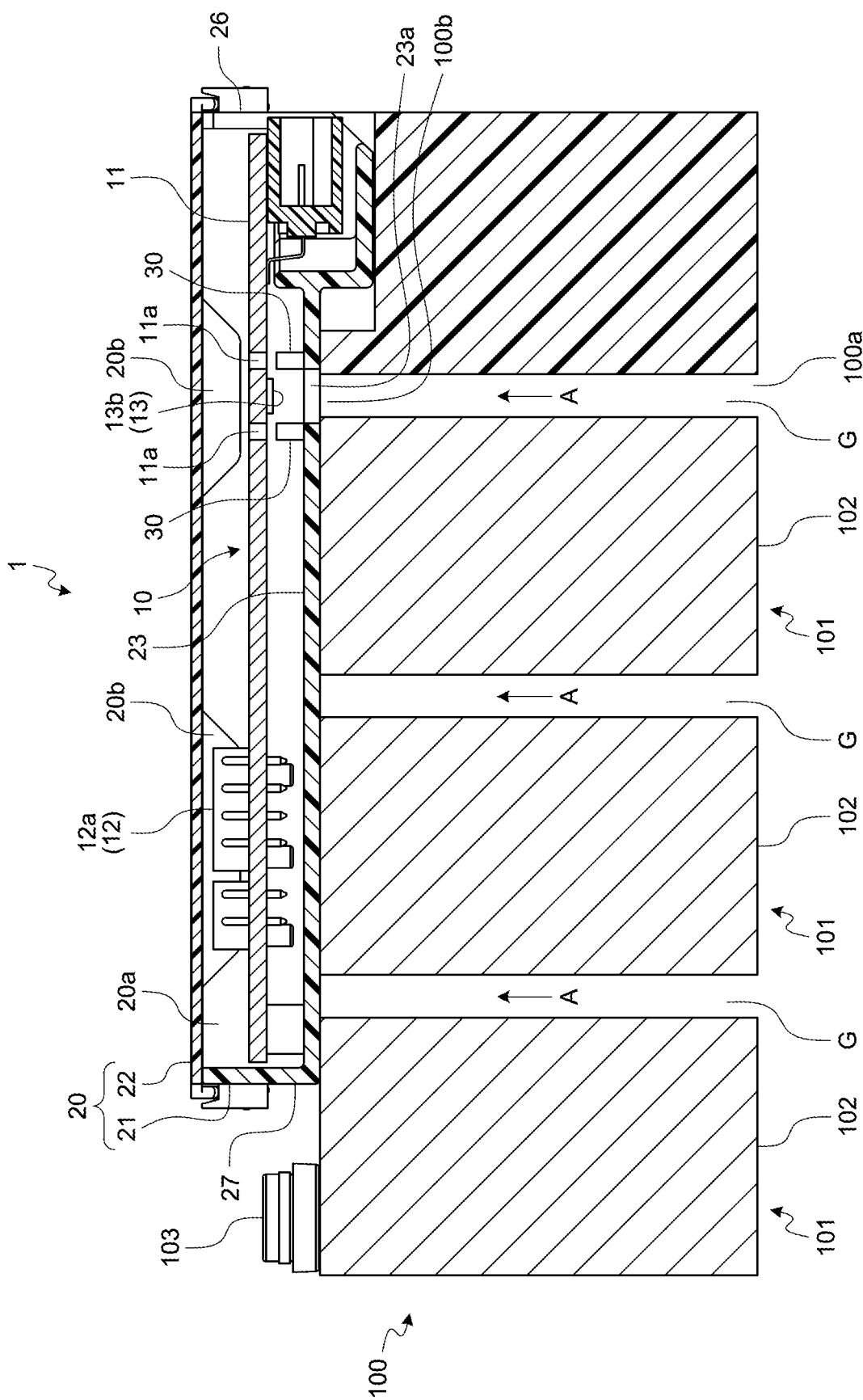
FIG. 2 is a partially enlarged cross-sectional view taken along a line X-X of FIG. 1 to illustrate the battery monitoring device.

The battery module 100 has a plurality of battery cells 101 arranged with intervals from each other (FIGS. 1 and 2). The battery cell 101 has a cell body 102 and a pair of electrode terminals 103 exposed to the outside in any place of the cell body 102. In this example, the cell body 102 is formed in a box shape. The battery module 100 forms a box by each battery cell 101. In addition, one of the electrode terminals 103 serves as a positive electrode, and the other electrode terminal 103 serves as a negative electrode. In this battery module 100, each battery cell 101 is arranged side by side while one type of the electrode terminals 103 of each battery cell 101 is arranged in a line, and the other type of electrode terminals 103 is also arranged in a line. Therefore, the battery module 100 has two pairs of sets of electrode terminals 103 (electrode terminal groups) arranged in a line. In this example, each electrode terminal group is arranged on one surface of the box-shaped battery module 100.

In one of the electrode terminal groups, for each combination of a pair of the neighboring electrode terminals 103, the two electrode terminals 103 are electrically coupled to each other with a conducting member, so that one of the electrode terminals 103 of the battery cell 101 in one end of the arrangement direction remains. In addition, in the other electrode terminal group, for each combination of a pair of the neighboring electrode terminals 103, the two electrode terminals 103 are electrically coupled to each other with a conducting member, so that the other electrode terminal 103 of the battery cell 101 in the other end of the arrangement direction remains. In the battery module 100, one of the two remaining electrode terminals 103 serves as a so-called external positive electrode, and the other remaining electrode terminal 103 serves as a so-called external negative electrode.

The battery module 100 is mounted on a vehicle such as an electric automobile or a hybrid car. This exemplary battery module 100 is installed such that a surface where the two electrode terminal groups are arranged is directed to the top of the vehicle. In this battery module 100, in order to maintain the arrangement state of the battery cells 101, each battery cell 101 is held by a holding member (not illustrated) in an integrated manner.

In the battery module 100 configured in this manner, since a difference in the battery capacity is generated between the battery cells 101 due to repeated charge and discharge operations as described above, it is necessary to remove such a battery capacity difference. The battery monitoring device 1 is responsible for removing such a battery capacity difference. Subsequently, the battery monitoring device 1 will be described.

The battery monitoring device 1 has a monitoring control unit 10 having a battery monitoring function for monitoring a battery state (such as voltage, current, and temperature) of each battery cell 101, and a battery control function for controlling each battery cell 101 on the basis of the monitoring result (FIGS. 1 to 6). In addition, the battery monitoring device 1 has a housing member 20 configured to house the monitoring control unit 10 (FIGS. 1 to 5).

The monitoring control unit 10 has a rectangular circuit board 11 (FIGS. 2 to 6). In addition, the monitoring control unit 10 has a battery monitoring unit 12 (FIGS. 2 to 4) for providing a battery monitoring function, and a battery control unit 13 (FIGS. 2 to 6) for providing a battery control function. The battery monitoring unit 12 and the battery control unit 13 are embedded in the circuit board 11.

The battery monitoring unit 12 is formed by a configuration well known in the art. For example, the battery monitoring unit 12 includes a battery monitoring integrated circuit (battery monitoring IC) 12a (FIGS. 2 to 4) responsible for control of the battery monitoring, or various elements such as a resistor or a capacitor (not illustrated).

The battery monitoring unit 12 measures, for example, a capacity (voltage), a current value, a temperature, and the like of the battery for each battery cell 101, and transmits a result of the measurement to the battery control unit 13 as a monitoring result. In this battery monitoring unit 12, as the electric current flows to the battery monitoring IC 12a, the element, and the like, heat is generated from the battery monitoring IC 12a and the like. The battery monitoring IC 12a, the battery monitoring element, and the like may serve as a heat radiation source that radiates heat as the electric current flows although a heat radiation amount may differ.

Figure 5:
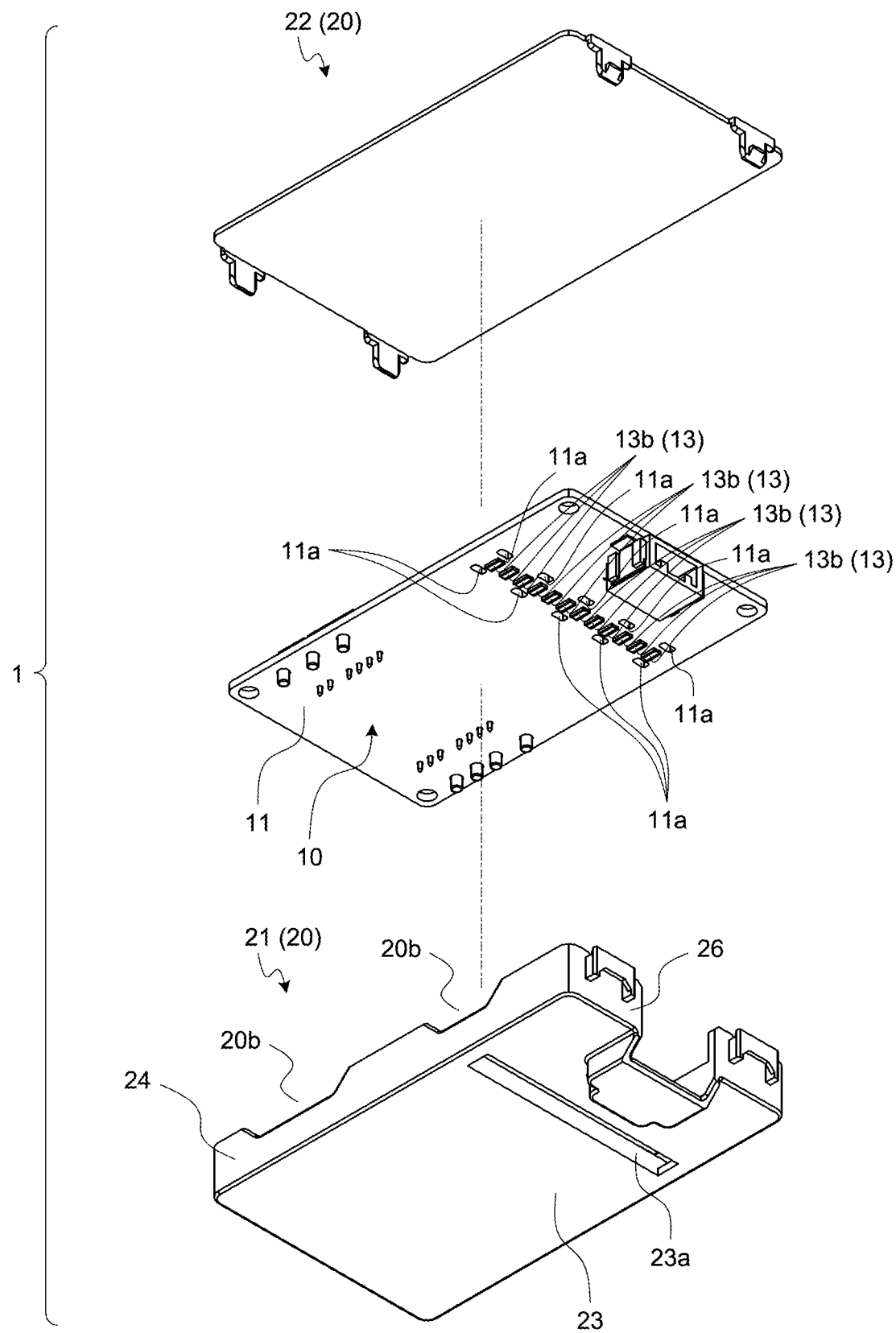
FIG. 5 is an exploded perspective view illustrating the battery monitoring device according to an embodiment as seen from a different angle.
Figure 6:
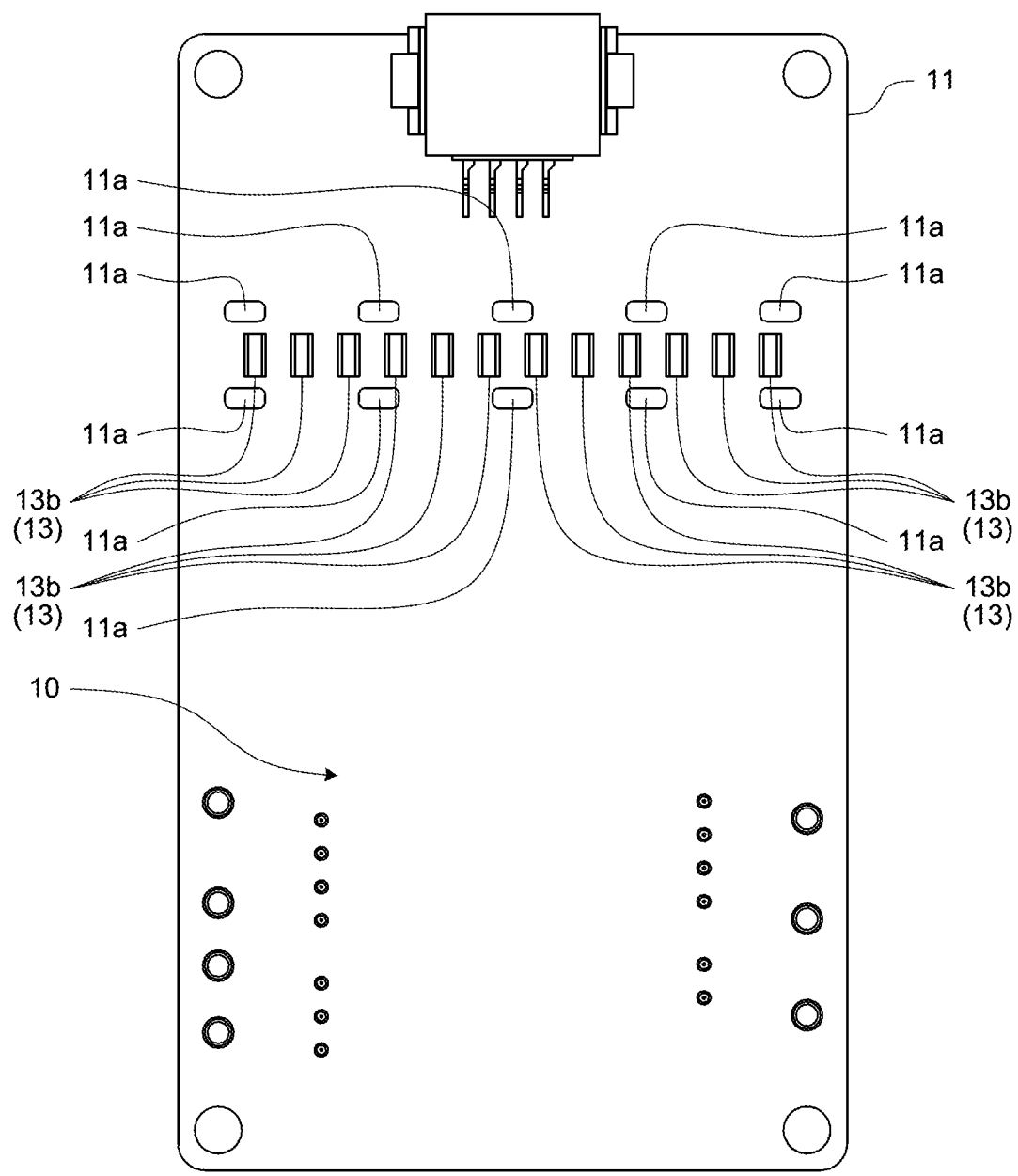
FIG. 6 is a top plan view illustrating a monitoring control unit.

The battery control unit 13 is formed by a configuration well known in the art. For example, the battery control unit 13 includes a battery control integrated circuit (battery control IC) 13a responsible for control of each battery cell 101 (FIGS. 3 and 4), and various elements such as a discharge resistor 13b (FIGS. 2, 5, and 6). Similarly, in the battery control unit 13, the battery control viewing IC 13a, the element, and the like may serve as a heat radiation source that radiates heat as the electric current flows although a heat radiation amount may differ.

The battery control IC 13a recognizes a battery capacity of each battery cell 101, for example, on the basis of the monitoring result received from the battery monitoring unit 12. The battery control IC 13a sets a battery cell 101 having the smallest battery capacity as a reference and calculates a difference between a battery capacity of the battery cell 101 serving as the reference (reference battery capacity) and a battery capacity of the remaining battery cell 101. The battery control IC 13a selects a battery cell 101 having a difference equal to or larger than a predetermined threshold value with respect to the reference battery capacity as a control target and temporarily stores the control target in a storage device (not illustrated) along with difference information of the battery capacity with respect to the reference battery capacity.

Here, the discharge resistor 13b is provided in each battery cell 101. In addition, the discharge resistor 13b is electrically coupled to the electrode terminal 103 of the battery cell 101 to be coupled in order to consume the battery capacity of this battery cell 101. The battery control IC 13a flows the electric current to the discharge resistor 13b of the battery cell 101 selected as a control target (discharge target) to consume the battery capacity of this battery cell 101 as much as the difference of the battery capacity with respect to the reference battery capacity. The battery control IC 13*a* tries to equalize the battery capacities of all battery cells 101 by reducing the battery capacities of all the control target battery cells 101.

Meanwhile, the monitoring control unit 10 has a heat radiation source that radiates heat as the electric current flows. The heat from the heat radiation source may degrade its function or durability depending on the heat radiation amount. In addition, since the monitoring control unit 10 is housed in a housing chamber 20*a* (FIGS. 2 to 4) of the housing member 20, the heat from the heat radiation source may increase an interior temperature of the housing chamber 20*a* and thus degrade function or durability of other components around the heat radiation source (including other heat radiation sources).

Figure 7:
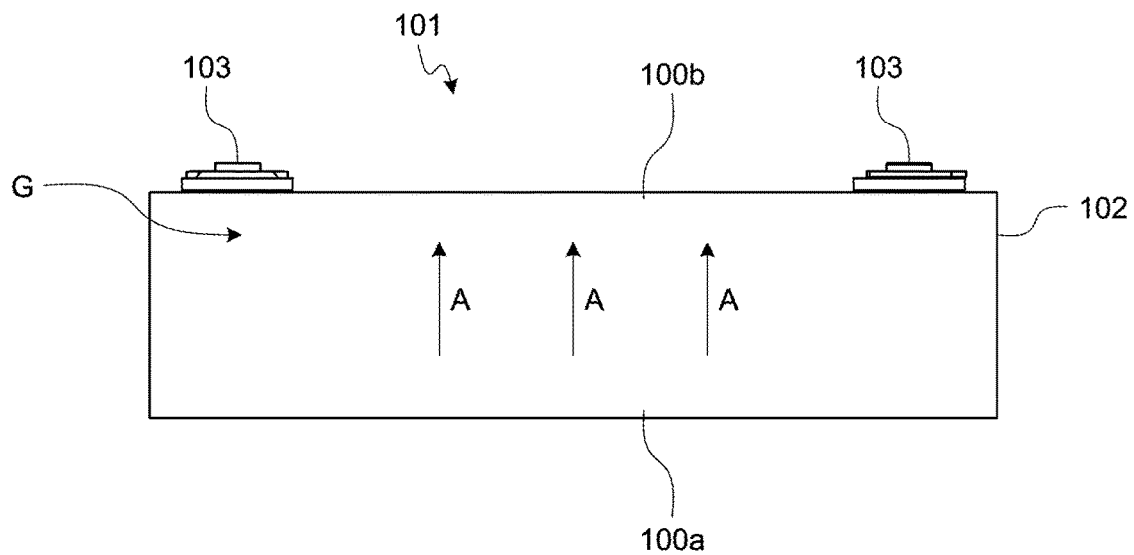
FIG. 7 is a diagram illustrating an exemplary air flow path between the battery cells.
Figure 8:
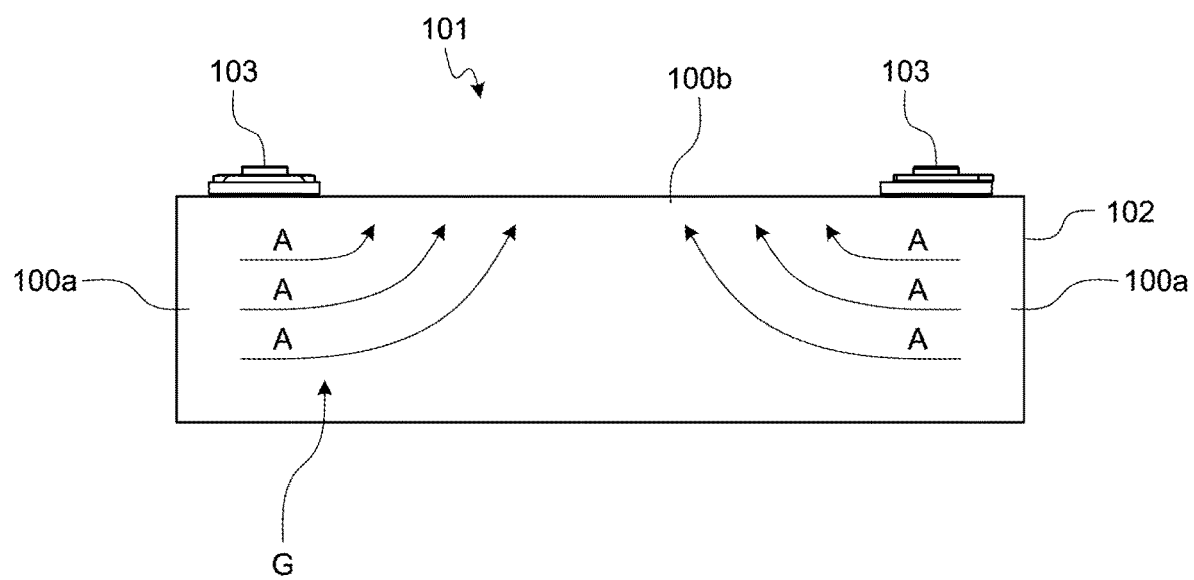
FIG. 8 is a diagram illustrating another exemplary air flow path between the battery cells.
Figure 9:
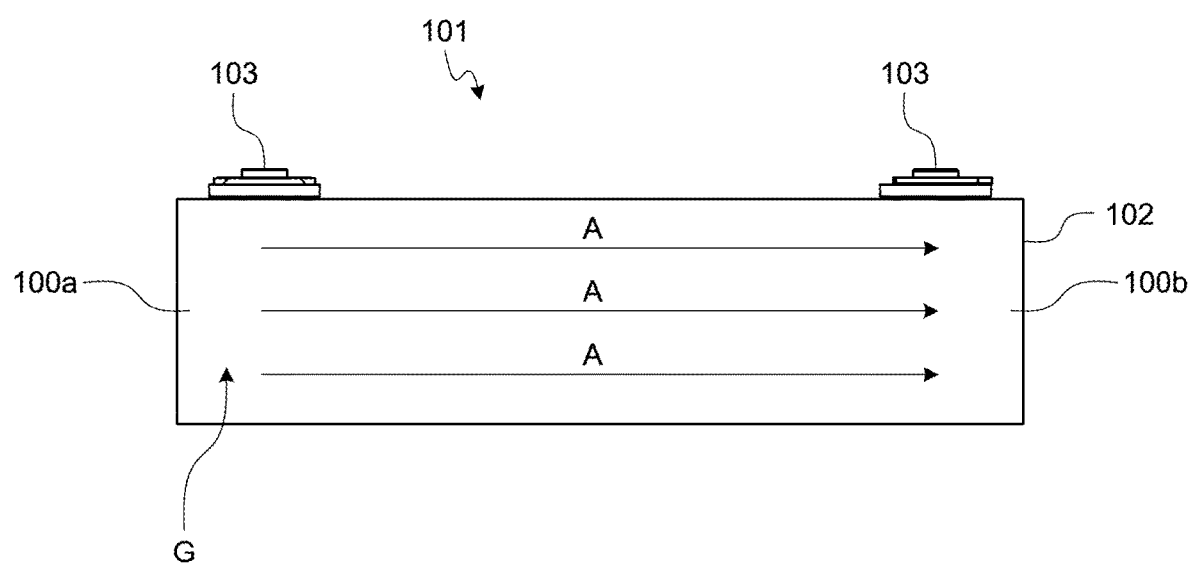
FIG. 9 is a diagram illustrating another exemplary air flow path between the battery cells.

Here, in the battery module 100, for example, for the purpose of cooling of each battery cell 101, air A flows to a gap G between the neighboring battery cells 101, and the flowing air A is discharged from the gap G (FIGS. 2 and 7 to 9). In the battery module 100, an inlet port 100*a* and an outlet port 100*b* of the air A for the gap G may be provided in any location. FIGS. 7 to 9 illustrate an exemplary flow path of the air A. FIG. 7 illustrates a case where the air A flows to the gap G from the inlet port 100*a* of the lower side (in this example, the lower side of the vehicle), and the air A of the gap G is discharged from the outlet port 100*b* of the upper side (in this example, the upper side of the vehicle). FIG. 8 illustrates a case where the air A flows to the gap G from the inlet port 100*a* of a pair of opposite lateral sides (in this example, the lateral side of the vehicle), and the air A of the gap G is discharged from the outlet port 100*b* of the upper side (in this example, the upper side of the vehicle). FIG. 9 illustrates a case where the air A flows to the gap G from the inlet port 100*a* of one of the lateral sides (the lateral side of the vehicle), and the air A of the gap G is discharged from the outlet port 100*b* of the other lateral side (the lateral side of the vehicle). In this example, it is assumed that the outlet port 100*b* of the air A is provided in the upper side (the upper side of the vehicle) where the electrode terminal 103 is arranged (FIG. 2).

In this battery monitoring device 1, cooling of the heat radiation source of the monitoring control unit 10 is performed using the air A discharged from the gap G between the neighboring battery cells 101. Therefore, the heat radiation source is arranged in a position where the air A discharged from the gap G collides the heat radiation source. That is, the heat radiation source is arranged in the middle of the flow path of the air A discharged from the gap G. For this purpose, in this battery monitoring device 1, other parts are not inserted in the middle of the flow path of the air A discharged from the gap G between the heat radiation source and the surface where the outlet port 100*b* of the battery module 100 is arranged.

In this battery monitoring device 1, the monitoring control unit 10 has a plurality of heat radiation sources. However, it is not necessary to set all of the heat radiation sources as cooling targets. In addition, in this battery monitoring device 1, the air A discharged from at least one of a plurality of gaps G of the battery module 100 may be used in cooling of the heat radiation source. For example, in this exemplary monitoring control unit 10, the discharge resistor 13*b* also serving as a heat radiation source has a larger heat radiation amount caused by the current flow, compared to other heat radiation sources. Therefore, here, it is assumed that the discharge resistor 13*b* is cooled. In addition, here, it is assumed that all of the discharge resistors 13*b* are cooled by the air A discharged from one of the gaps G of the battery module 100.

The discharge resistor 13*b* as a heat radiation source is preferably arranged to face the outlet port 100*b*. As a result, in this battery monitoring device 1, the air A discharged from the outlet port 100*b* can easily collide with the discharge resistor 13*b*, and this improves cooling efficiency. In addition, in this battery monitoring device 1, the air A discharged from the outlet port 100*b* can collide with the discharge resistor 13*b* before a temperature of the air A increases to the atmospheric temperature or while a temperature increase of the air A is suppressed to be low. This also improves cooling efficiency. Each discharge resistor 13*b* may be arranged in any form as long as each discharge resistor 13*b* is arranged to face the outlet port 100*b*. For example, in this example, all of the discharge resistors 13*b* are arranged in a line along the outlet ports 100*b*. In addition, each discharge resistor 13*b* may be arranged in a plurality of lines along the outlet ports 100*b*, or may be arranged in a meandering manner while alternately shifting neighboring discharge resistors 13*b* from each other.

Figure 4:
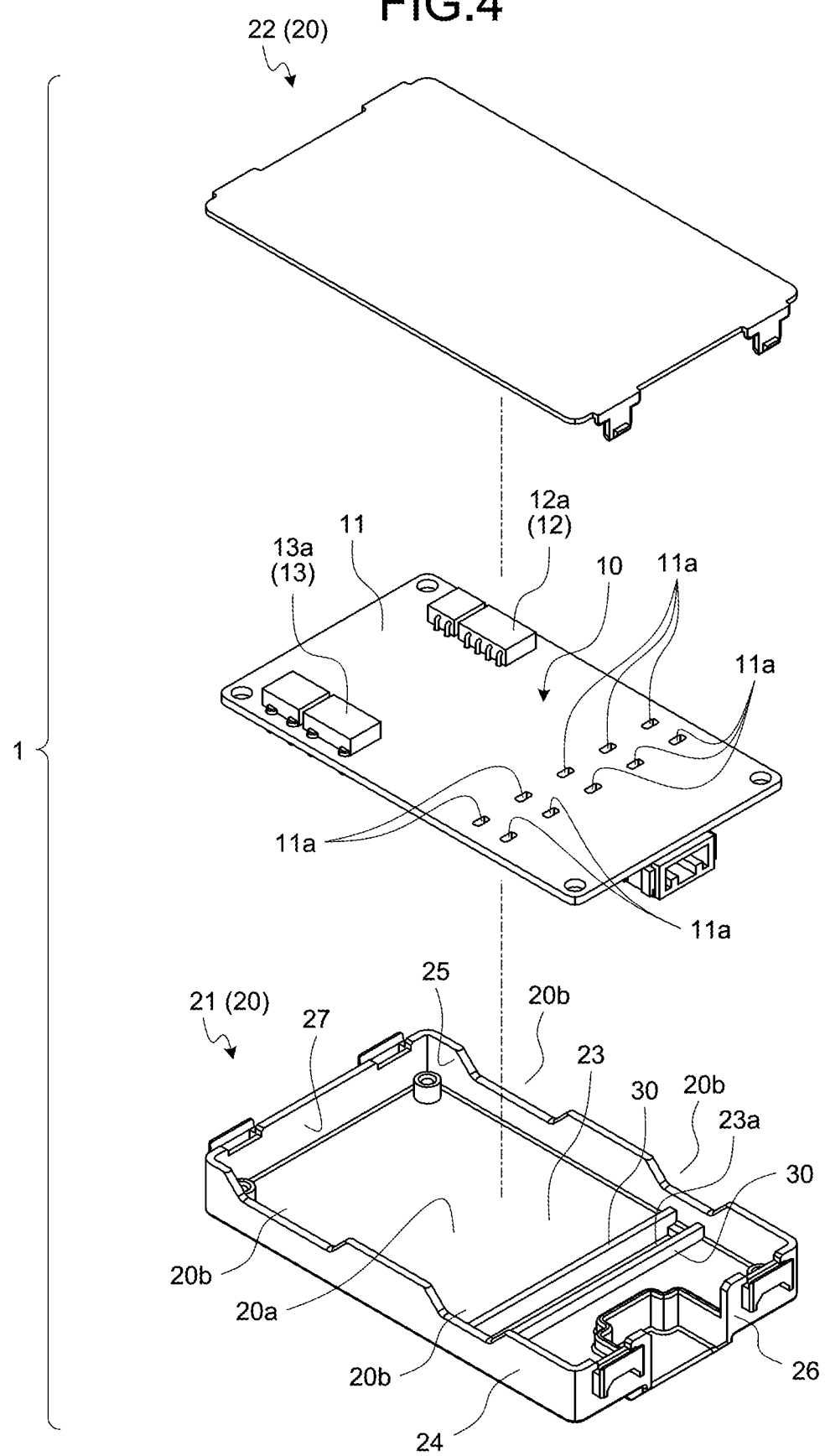
FIG. 4 is an exploded perspective view illustrating the battery monitoring device according to an embodiment.

The battery monitoring device 1 may also include a guide portion 30 configured to guide the air A discharged from the gap G to the discharge resistor 13*b* as a heat radiation source (FIGS. 2 and 4). As a result, in this battery monitoring device 1, it is possible to guide the air A to the discharge resistor 13*b* while suppressing dispersion of the air A discharged from the outlet port 100*b* to the surroundings. This improves cooling efficiency. The air A discharged from the outlet port 100*b* is guided to the discharge resistor 13*b* via the shortest path while suppressing dispersion to the surroundings, for example, if the discharge resistor 13*b* is arranged to face the outlet port 100*b*. Therefore, in this case, it is possible to obtain the best cooling efficiency. In addition, the air A discharged from the outlet port 100*b* is also guided to the discharge resistor 13*b* while suppressing dispersion to the surroundings, for example, even when the discharge resistor 13*b* is not arranged to face the outlet port 100*b*. Therefore, this battery monitoring device 1 can improve cooling efficiency even when it is difficult to arrange the discharge resistor 13*b* in a position facing the outlet port 100*b* due to a layout relationship or the like. Furthermore, in this battery monitoring device 1, even when it is difficult to cause the air A discharged from the gap G to collide directly with the discharge resistor 13*b*, it is possible to generate a flow path of the air A directed to the discharge resistor 13*b* using the guide portion 30. Therefore, it is possible to improve cooling efficiency. In this example, the guide portion 30 is provided in the housing member 20.

Here, in this battery monitoring device 1, the monitoring control unit 10 is housed in the housing chamber 20*a* of the housing member 20. The housing member 20 is formed of an insulation material such as synthetic resin. The housing member 20 of this example has a housing body 21 and a cover body 22 (FIGS. 2 to 5). The housing body 21 has a rectangular wall body 23 (FIGS. 2 to 5) and upright wall bodies 24, 25, 26, and 27 (FIGS. 3 and 4) erected perpendicularly from four side portions of the wall body 23. In the housing member 20, a box-shaped space surrounded by the wall body 23 and the upright wall bodies 24, 25, 26, and 27 corresponds to the housing chamber 20*a*. The cover body 22 is formed in a rectangular flat plate shape to block a rectangular opening of the housing chamber 20*a*.

In this battery monitoring device 1, the wall body 23 of the housing member 20 is interposed in the middle of the flow path of the air A discharged from the gap G between the discharge resistor 13*b* as a heat radiation source and the surface where the outlet port 100*b* of the battery module 100 is arranged. Therefore, an air introduction hole 23*a* for flowing the air A discharged from the gap G into the housing chamber 20*a* is formed in the wall body 23 (FIGS. 2, 4, and 5). The air introduction hole 23*a* is provided in the middle of the flow path of the air A discharged from the gap G. Here, the air introduction hole 23*a* is arranged to face the outlet port 100*b*.

In this case, since the discharge resistor 13*b* is arranged to face the air introduction hole 23*a*, the discharge resistor 13*b* is preferably arranged to face the outlet port 100*b* as a result. When this arrangement is employed, the air introduction hole 23*a* is preferably formed in a size so as to be arranged to face all of the discharge resistors 13*b*. In addition, when this arrangement is employed in the battery monitoring device 1, cooling efficiency may be further improved by providing the guide portion 30 as described above. The guide portion 30 is erected toward the housing chamber 20*a* from the peripheral edge of the air introduction hole 23*a* (FIG. 4). Here, two rectangular wall bodies are erected from two longitudinal edges of the air introduction hole 23*a* arranged to face each other and are used as the guide portion 30. Alternatively, the discharge resistor 13*b* may not be necessarily arranged to face the air introduction hole 23*a* if the guide portion 30 is provided.

In this battery monitoring device 1, cooling efficiency is improved by introducing the air A to the housing chamber 20*a* in this manner. However, if a discharge of the air A from the housing chamber 20*a* is unsatisfactory, it is difficult to introduce new air to the housing chamber 20*a*. In this regard, the housing member 20 preferably has a discharge hole 20*b* for discharging the air A of the housing chamber 20*a* colliding with and passing through the discharge resistor 13*b* as a heat radiation source to the outside of the housing chamber 20*a* (FIGS. 2 to 5). As a result, in this battery monitoring device 1, while the air A of the housing chamber 20*a* is discharged from the discharge hole 20*b*, the new air flows from the air introduction hole 23*a*. Therefore, it is possible to suppress degradation of cooling efficiency that may occur when the air A stagnates in the housing chamber 20*a*.

Figure 3:
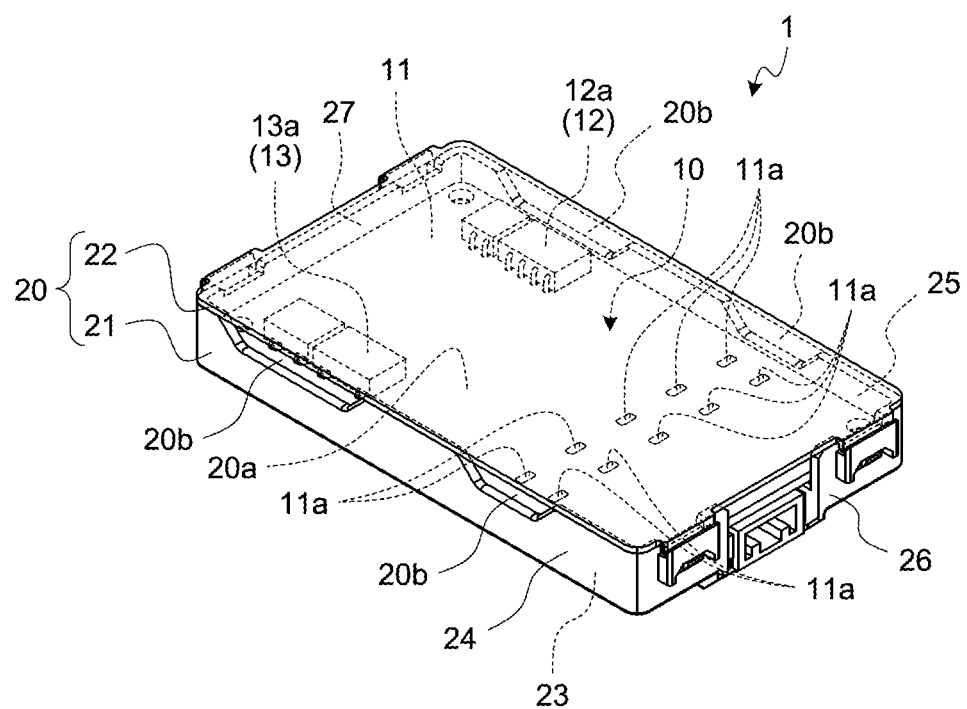
FIG. 3 is a perspective view illustrating the battery monitoring device according to an embodiment.

In this example, two discharge holes 20*b* are provided in each of the opposite upright wall bodies 24 and 25 (FIGS. 3 and 4). For example, the housing member 20 has a hole for extracting a wire (not illustrated) connected to the monitoring control unit 10 to the outside of the housing chamber 20*a*. Here, this hole is used as the discharge hole 20*b*.

The discharge hole 20*b* is arranged close to the cover body 22 relative to the circuit board 11 in the housing chamber 20*a*. Meanwhile, the discharge resistor 13*b* is arranged close to the wall body 23 relative to the circuit board 11 in the housing chamber 20*a*. Therefore, in this exemplary housing chamber 20*a*, the air A colliding with the discharge resistor 13*b* does not easily reach the discharge hole 20*b*. In this regard, in this example, the circuit board 11 has a through-hole 11*a* for guiding the air A colliding with the discharge resistor 13*b* to the cover body 22 side (FIGS. 2 to 6). The through-hole 11*a* is formed in the middle of the flow path of the air A colliding with the discharge resistor 13*b*. Here, the plurality of through-holes 11*a* are formed in the vicinity of the discharge resistor 13*b*. In this example, a group of through-holes including the plurality of rectangular through-holes 11*a* are arranged side by side along two lines, and all of the discharge resistors 13*b* are arranged between the group of through-holes. As a result, in the housing chamber 20*a*, the air A colliding with each discharge resistor 13*b* is easily guided to each through-hole 11*a*. Therefore, the air A is guided from the circuit board 11 to the cover body 22 side through each of the through-holes 11*a*. The air A guided from the circuit board 11 to the cover body 22 side is discharged to the outside of the housing chamber 20*a* through each discharge hole 20*b*. In this manner, in this battery monitoring device 1, it is possible to suppress stagnation of the air A colliding with the discharge resistor 13*b* in the housing chamber 20*a*. Therefore, it is possible to further suppress degradation of cooling efficiency using the discharge hole 20*b*.

Meanwhile, in the battery module 100, the battery cell 101 itself also radiates and retains heat. Therefore, in the battery module 100, the atmospheric temperature is higher in the center side in the arrangement direction of the battery cells 101 and is lower in the end side among gaps G provided in a plurality of places. Therefore, the discharge resistor 13*b* as a heat radiation source is preferably arranged (more preferably, oppositely) close to the gap G of the end side in the arrangement direction of the battery cell 101 among all of the gaps G. As a result, in this battery monitoring device 1, it is possible to guide the air A having a low temperature toward the discharge resistor 13*b* out of the air A of all the gaps G. Therefore, it is possible to obtain higher cooling efficiency.

As described above, in the battery monitoring device 1 according to this embodiment, the air A flowing through the gap G between the battery cells 101 collides with the heat radiation source. Therefore, it is possible to suppress the heat radiation amount of the heat radiation source to be low. As a result, it is possible to cool the heat radiation source or its surroundings. Accordingly, using this battery monitoring device 1, it is possible to obtain high cooling efficiency for the heat radiation source or its surroundings. Furthermore, the battery monitoring device 1 implements such a configuration without preparing a new component and increasing the size compared to the configuration of the related art. Therefore, using the battery monitoring device 1, it is possible to obtain high cooling efficiency while suppressing an increase of the size.

Note that the housing member 20 according to this embodiment surrounds the monitoring control unit 10 as a whole by way of example. Alternatively, the housing member may be formed without interposing the wall body between the monitoring control unit 10 and the battery module 100 (that is, the wall body 23 may be omitted from the housing member 20 described above). Using the battery monitoring device 1 according this embodiment, it is possible to obtain the same effects as those described above even by applying such a housing member.

In the battery monitoring device according to the embodiment, the air flowing through the gap between the battery cells collides with the heat radiation source. Therefore, it is possible to suppress a heat radiation amount of the heat radiation source to be low. As a result, it is possible to cool the heat radiation source or its surroundings. Accordingly, using this battery monitoring device, it is possible to achieve high cooling efficiency for the heat radiation source or its surroundings.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A battery monitoring device comprising:
a monitoring controller configured to monitor a battery state of each battery cell of a battery module formed by arranging the plurality of battery cells and control each of the battery cells on the basis of a monitoring result, a gap being provided between the neighboring battery cells, wherein
the monitoring controller has a heat radiation source that radiates heat as an electric current flows, and
the heat radiation source is arranged in a position aligned with the gap such that air discharged from the gap between the neighboring battery cells directly collides with the heat radiation source.

2. The battery monitoring device according to claim 1, wherein
the heat radiation source is arranged to face an outlet port from which the air of the gap between the neighboring battery cells is discharged.

3. The battery monitoring device according to claim 1, further comprising:
a guide portion configured to guide the air discharged from the gap between the neighboring battery cells to the heat radiation source.

4. The battery monitoring device according to claim 2, further comprising:
a guide portion configured to guide the air discharged from the gap between the neighboring battery cells to the heat radiation source.

5. The battery monitoring device according to claim 1, further comprising:
a housing member configured to house the monitoring controller, wherein
the housing member has a wall body interposed between the heat radiation source and the battery module, and
the wall body has an air introduction hole configured to flow the air discharged from the gap between the neighboring battery cells to a housing chamber of the housing member.

6. The battery monitoring device according to claim 2, further comprising:
a housing member configured to house the monitoring controller, wherein
the housing member has a wall body interposed between the heat radiation source and the battery module, and
the wall body has an air introduction hole configured to flow the air discharged from the gap between the neighboring battery cells to a housing chamber of the housing member.

7. The battery monitoring device according to claim 3, further comprising:
a housing member configured to house the monitoring controller, wherein
the housing member has a wall body interposed between the heat radiation source and the battery module, and
the wall body has an air introduction hole configured to flow the air discharged from the gap between the neighboring battery cells to a housing chamber of the housing member.

8. The battery monitoring device according to claim 4, further comprising:
a housing member configured to house the monitoring controller, wherein
the housing member has a wall body interposed between the heat radiation source and the battery module, and
the wall body has an air introduction hole configured to flow the air discharged from the gap between the neighboring battery cells to a housing chamber of the housing member.

9. The battery monitoring device according to claim 5, wherein
the housing member has a discharge hole configured to discharge the air of the housing chamber colliding with and passing through the heat radiation source to the outside of the housing chamber.

10. The battery monitoring device according to claim 6, wherein
the housing member has a discharge hole configured to discharge the air of the housing chamber colliding with and passing through the heat radiation source to the outside of the housing chamber.

11. The battery monitoring device according to claim 7, wherein
the housing member has a discharge hole configured to discharge the air of the housing chamber colliding with and passing through the heat radiation source to the outside of the housing chamber.

12. The battery monitoring device according to claim 8, wherein
the housing member has a discharge hole configured to discharge the air of the housing chamber colliding with and passing through the heat radiation source to the outside of the housing chamber.

13. The battery monitoring device according to claim 1, wherein
the monitoring controller has a discharge resistor in each of the battery cells as the heat radiation source, and
battery capacities of all the battery cells are equalized by flowing an electric current to the discharge resistor of the battery cell set as a discharge target on the basis of the monitoring result.

14. The battery monitoring device according to claim 2, wherein
the monitoring controller has a discharge resistor in each of the battery cells as the heat radiation source, and
battery capacities of all the battery cells are equalized by flowing an electric current to the discharge resistor of the battery cell set as a discharge target on the basis of the monitoring result.

15. The battery monitoring device according to claim 3, wherein
the monitoring controller has a discharge resistor in each of the battery cells as the heat radiation source, and
battery capacities of all the battery cells are equalized by flowing an electric current to the discharge resistor of the battery cell set as a discharge target on the basis of the monitoring result.

16. The battery monitoring device according to claim 4, wherein
the monitoring controller has a discharge resistor in each of the battery cells as the heat radiation source, and
battery capacities of all the battery cells are equalized by flowing an electric current to the discharge resistor of the battery cell set as a discharge target on the basis of the monitoring result.

17. The battery monitoring device according to claim 5, wherein
the monitoring controller has a discharge resistor in each of the battery cells as the heat radiation source, and battery capacities of all the battery cells are equalized by flowing an electric current to the discharge resistor of the battery cell set as a discharge target on the basis of the monitoring result.

18. The battery monitoring device according to claim 6, wherein the monitoring controller has a discharge resistor in each of the battery cells as the heat radiation source, and battery capacities of all the battery cells are equalized by flowing an electric current to the discharge resistor of the battery cell set as a discharge target on the basis of the monitoring result.

19. The battery monitoring device according to claim 7, wherein the monitoring controller has a discharge resistor in each of the battery cells as the heat radiation source, and battery capacities of all the battery cells are equalized by flowing an electric current to the discharge resistor of the battery cell set as a discharge target on the basis of the monitoring result.

20. The battery monitoring device according to claim 9, wherein the monitoring controller has a discharge resistor in each of the battery cells as the heat radiation source, and battery capacities of all the battery cells are equalized by flowing an electric current to the discharge resistor of the battery cell set as a discharge target on the basis of the monitoring result.

* * * * *